(12) United States Patent
Eng, Jr.

(10) Patent No.: US 7,854,549 B2
(45) Date of Patent: Dec. 21, 2010

(54) SYSTEMS AND METHODS FOR DISSIPATING HEAT GENERATED DURING AN ELECTRICAL MEASUREMENT

(75) Inventor: Benjamin Eng, Jr., Everett, WA (US)

(73) Assignee: Fluke Corporation, Everett, WA (US)

( * ) Notice: Subject to any disclaimer, the term of this patent is extended or adjusted under 35 U.S.C. 154(b) by 483 days.

(21) Appl. No.: 11/824,481

(22) Filed: Jun. 29, 2007

(65) Prior Publication Data

US 2009/0003410 A1   Jan. 1, 2009

(51) Int. Cl.
*G01K 7/00* (2006.01)
(52) U.S. Cl. .................. 374/185; 374/183; 374/166
(58) Field of Classification Search .............. 374/183, 374/185, 166
See application file for complete search history.

(56) References Cited

U.S. PATENT DOCUMENTS

| 4,133,700 A | * | 1/1979 | Hollander et al. ............ 374/181 |
| 4,298,947 A | * | 11/1981 | Tamura et al. ............... 702/130 |
| 4,586,149 A | * | 4/1986 | Stillman et al. .............. 700/300 |
| 6,651,020 B2 | * | 11/2003 | More .......................... 702/99 |

* cited by examiner

*Primary Examiner*—Lisa M Caputo
*Assistant Examiner*—Mirellys Jagan
(74) *Attorney, Agent, or Firm*—Perkins Core LLP

(57) ABSTRACT

Systems and methods for dissipating heat generated during an electrical function are disclosed. In particular, the disclosed systems and methods can be used for dissipating heat generated during low impedance measurement on a multimeter. In some embodiments, the multimeter can include a first thermistor coupled in series with a resistor in a measurement path, a second thermistor, and a switch coupled to the measurement path and the second thermistor for selectively including the second thermistor in the measurement path during a low impedance measurement.

11 Claims, 5 Drawing Sheets

SYSTEMS AND METHODS FOR DISSIPATING HEAT GENERATED DURING AN ELECTRICAL MEASUREMENT

BACKGROUND

Modern digital multimeters (DMMs) can suffer from ghost voltages. Ghost voltages can occur when energized circuits and non-energized wiring are located in close proximity to each other, such as in the same conduit or raceway. This condition forms a capacitor and allows capacitive coupling between the energized wiring and the adjacent unused wiring. When multimeter leads are placed between the open circuit and the neutral conductor, the circuit is effectively completed through the input of the multimeter. The capacitance between the connected, hot conductor and the floating conductor forms a voltage divider in conjunction with the multimeter input impedance. The multimeter then measures and displays the resulting voltage value, which can be misleading.

Most modern DMMs for testing industrial, electrical, and electronic systems have high impedance input circuits greater than 1 megohm. As a result, when the DMM is placed across a circuit for a measurement, it will have little impact on circuit performance. This is the desired effect for most voltage measurement applications, and is especially important for sensitive electronics or control circuits. However, this high impedance can contribute to the ghost voltage effect. Many DMMs have an input impedance that's high enough to show the capacitively coupled voltage, giving a false impression of a live conductor. That is, the meter is actually measuring voltage coupled into the disconnected conductor.

To compensate for this effect, DMMs can include a low impedance function, often called "LoZ." This feature presents a low impedance input to the circuit under test. This reduces the possibility of false readings due to ghost voltages and improves accuracy when testing to determine absence or presence of voltage. The LoZ switch position on the DMM can be used when readings are suspect (ghost voltages may be present) or when testing for the presence of voltage. Typical implementations of LoZ functionality pass current through a resistor. In LoZ mode, the resistor can generate a significant amount of heat, and this heat can adversely impact the accuracy of further measurements taken with the DMM.

The headings provided herein are for convenience only and do not necessarily affect the scope or meaning of the claimed invention.

DETAILED DESCRIPTION

In a broad sense, systems and methods for dissipating heat generated when operating a multimeter in LoZ mode are disclosed in detail below. The systems and methods described herein can efficiently excess power through a non-critical thermistor coupled in series with a thermistor in the measurement path.

Basic Operation of the Meter

Figure 1:
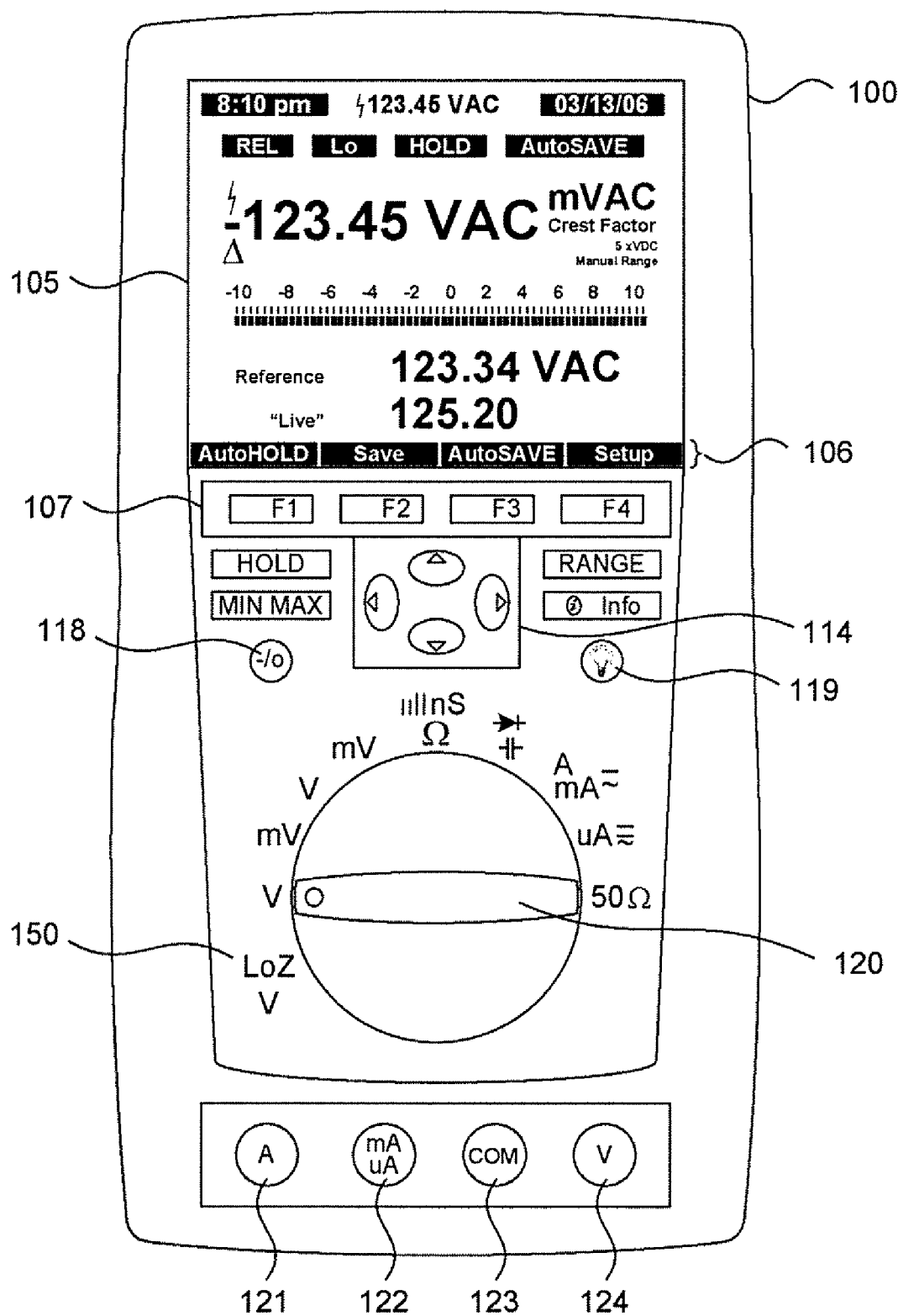
FIG. 1 illustrates the front face of a digital multimeter.

An example meter 100 is illustrated in FIG. 1. The meter can include display 105 and rotary switch 120. A user can interact with the meter by using any one of several interfaces. For input, any of the buttons and/or rotary switch 120 can be used to request various measurements and processed versions of those measurements. A secondary button can be pressed to select any rotary switch alternate function. Other buttons can be used to choose modifiers for the selected function.

Analog connections on input jacks 121-124 can be used to provide measurement input to the meter. In some embodiments, four jacks can be included along the bottom of the meter where the user can connect input probes used to measure signals of interest. Output is presented to the user with a dot-matrix LCD such as display 105, an indicator light, and/or an audible beeper. A remote interface can also be used to provide another way to control and query the meter.

The area between the display 105 and the rotary switch 120 can contain various soft keys and buttons. The lower portion of the display area 105 can contain labels 106 corresponding to the soft keys 107 (labeled [F1] through [F4]) below the display 105. Pressing one of the soft keys invokes the function indicated by the corresponding label on the display. The meter 100 can also include navigation buttons 114, an on/off switch 118, and a backlight control button 119. In some embodiments, the meter can use four AA alkaline batteries and can use any of several techniques to conserve battery power.

In embodiments supporting LoZ functionality, the rotary switch 120 can be rotated to position 150 which is labeled "LoZ." At position 150, the meter will operate in LoZ mode and can further employ the systems and methods for heat dissipation described below. In other embodiments, LoZ mode can be selected by operation of one or more of soft keys 107.

LoZ Operational Mode

The LoZ mode can be used to measure voltage or capacitance with a low input impedance. In this mode, the DMM presents a low impedance input to the circuit under test. This reduces the possibility of false readings due to ghost voltages and improves accuracy when testing to determine absence or presence of voltage. When in low impedance mode, there is an increased risk that a high current may be conducted through the measurement circuitry as a high voltage may be placed across the leads of the device. To protect the DMM circuitry, a resistor and thermistor may be connected in series with the current or voltage source being measured. The thermistors described herein can be any type of electrical device that has a resistance that varies based on the temperature of the device.

Figure 2:
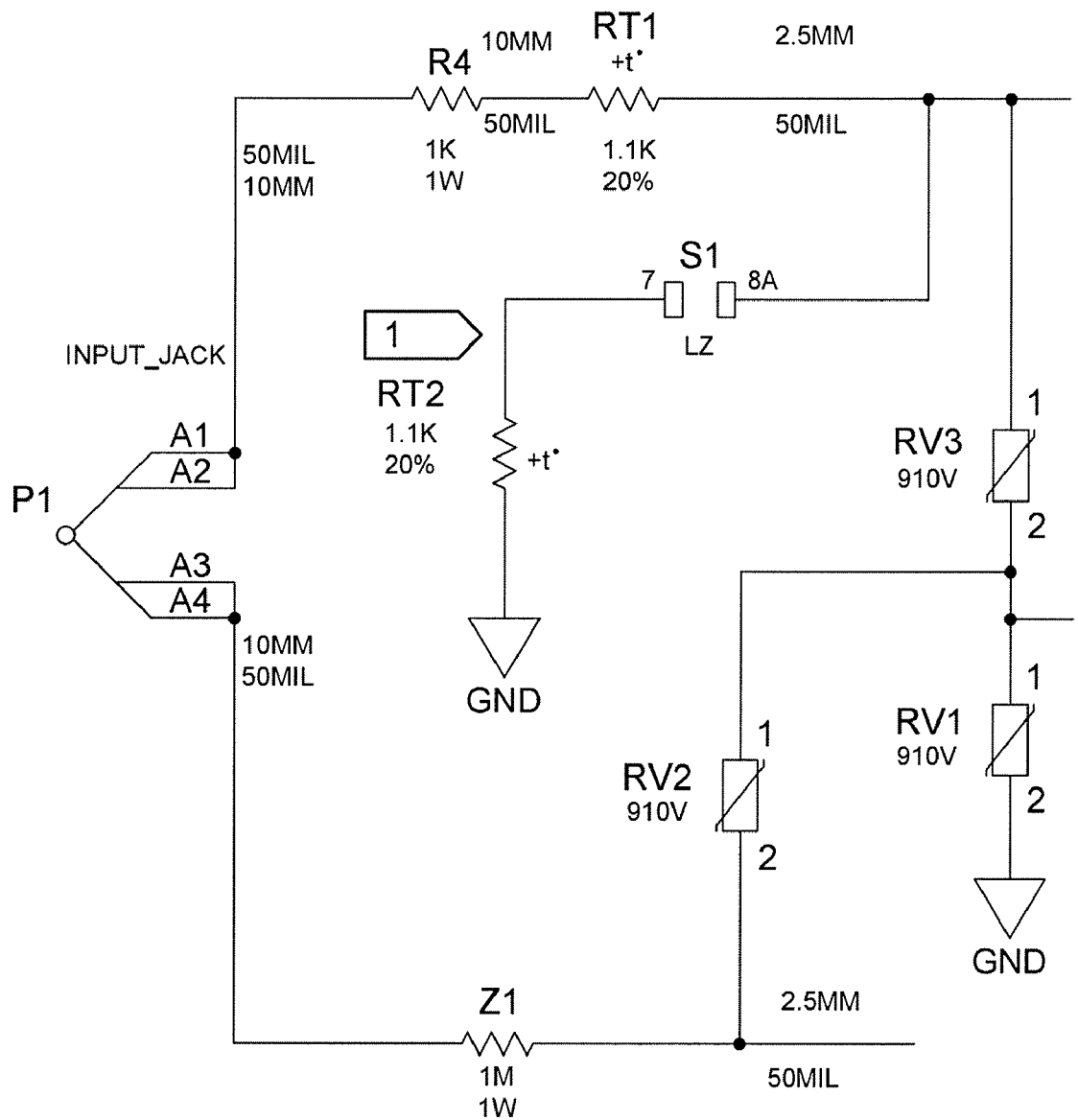
FIG. 2 illustrates a schematic for one embodiment of a LoZ circuit.

As illustrated in FIG. 2, resistor R4 and thermistor RT1 may be connected in series with the source so that current will flow through resistor R4 and thermistor RT1. As non-limiting examples, resistor R4 may be a 1.1 KOhm resistor and RT1 may be a 1.1 KOhm thermistor. If a high current is passed through thermistor RT1, RT1 will become hotter, and its resistance will increase. This will reduce the current through the measurement circuit. As thermistor RT1 becomes hotter, its heat is conducted to other components on the printed circuit board. This conduction of heat to other components can negatively impact the accuracy of other measurements. Additionally, when RT1 is heated, its own resistivity is also temporarily increased, impacting the accuracy of other measurements which use the same measurement circuitry.

When in use, thermistor RT1 will heat up and it may take some time before various components in the DMM will return to normal operating temperatures. Additionally, other components in the meter may become heated and create thermal voltages, thermal gradients, and other problems that impact measurement accuracy. If only relatively low-accuracy measurements are required, it may be necessary to wait 5-10 minutes for a unit using only one thermistor to return to normal operating temperatures. If relatively high accuracy measurements are required, it may be necessary to wait 30-40 minutes for using a unit using only one thermistor to return to normal operating temperatures.

Second Thermistor

To enable thermistor RT1 in the measurement path to return to normal operating temperatures faster, a non-critical second thermistor can be added to the circuit. In some embodiments, the addition of a second thermistor can substantially reduce time to obtain a reading within the accuracy requirements through the measurement path. As illustrated in FIG. 2, thermistor RT2 can be included in series with switch S1 and thereby coupled to ground. Thus, an additional thermistor can be included in the circuitry so that two thermistors (RT1 and RT2) plus a resistor (R1) are arranged in series. Switch S1 can be closed by rotary switch 120 or by a processor responsive to soft keys 107. Once S1 is closed, R4 is then in series with RT1 and RT2. In this configuration, heat generated during a measurement can be dissipated by two thermistors.

In some embodiments, thermistors having an accuracy of +/−20% may be used. In some embodiments, thermistor RT2 can be of greater resistance than thermistor RT1. If RT2 is of greater resistance, RT2 will dissipate more heat than thermistor RT1. To select a pair of resistors to use as RT1 and RT2, a pair of thermistors rated for the same resistance can be tested and compared to each other. Assuming slight sample variation, the thermistor having the greater resistance can be placed in the RT2 position.

Figure 3:
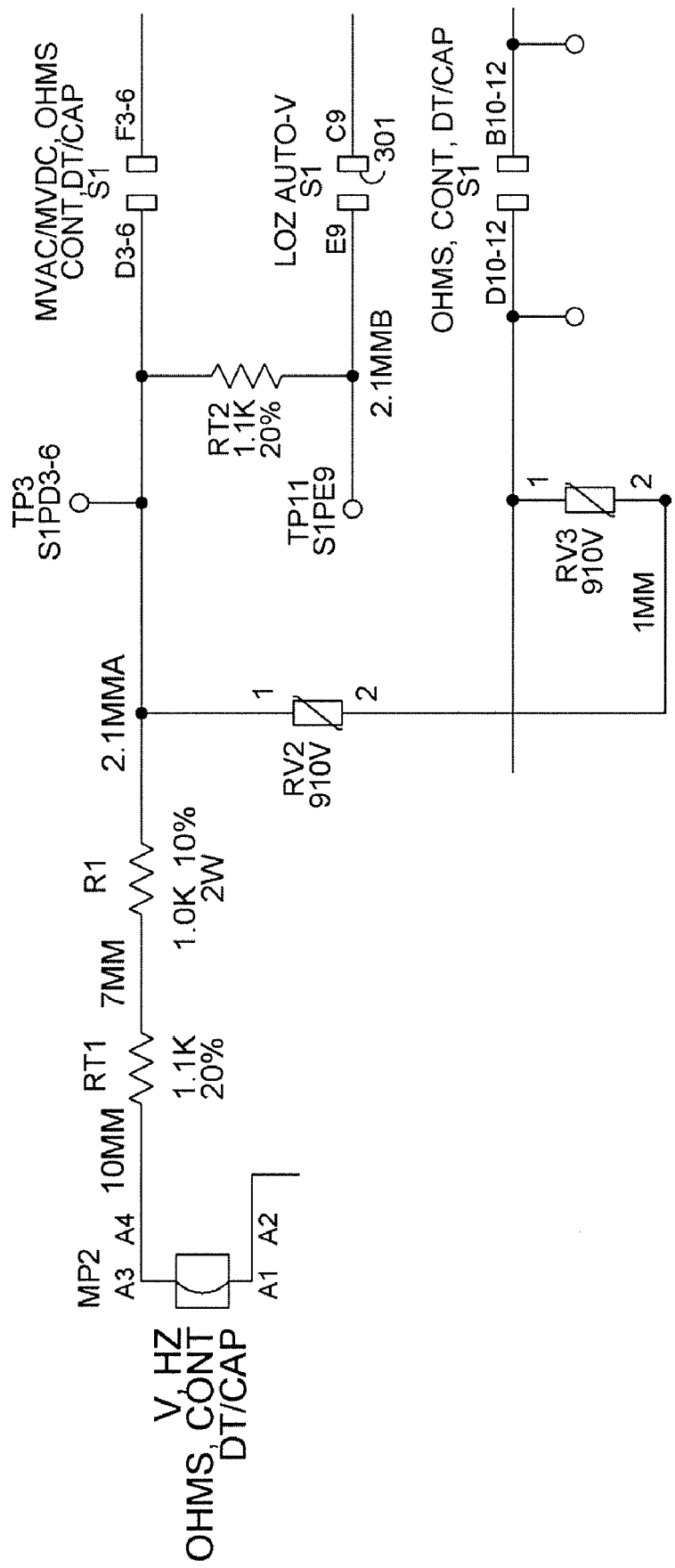
FIG. 3 illustrates a schematic for another embodiment of a LoZ circuit.

An alternative circuit for switching in a non-critical thermistor for LoZ operation is illustrated in FIG. 3. As illustrated in FIG. 3, thermistor RT1 and resistor R1 are arranged in series. Thermistor RT2 can be coupled in series with RT1 and R1 by action of switch S1 (301). FIG. 3 further illustrates the inclusion of clamps RV2 and RV3.

Figure 4:
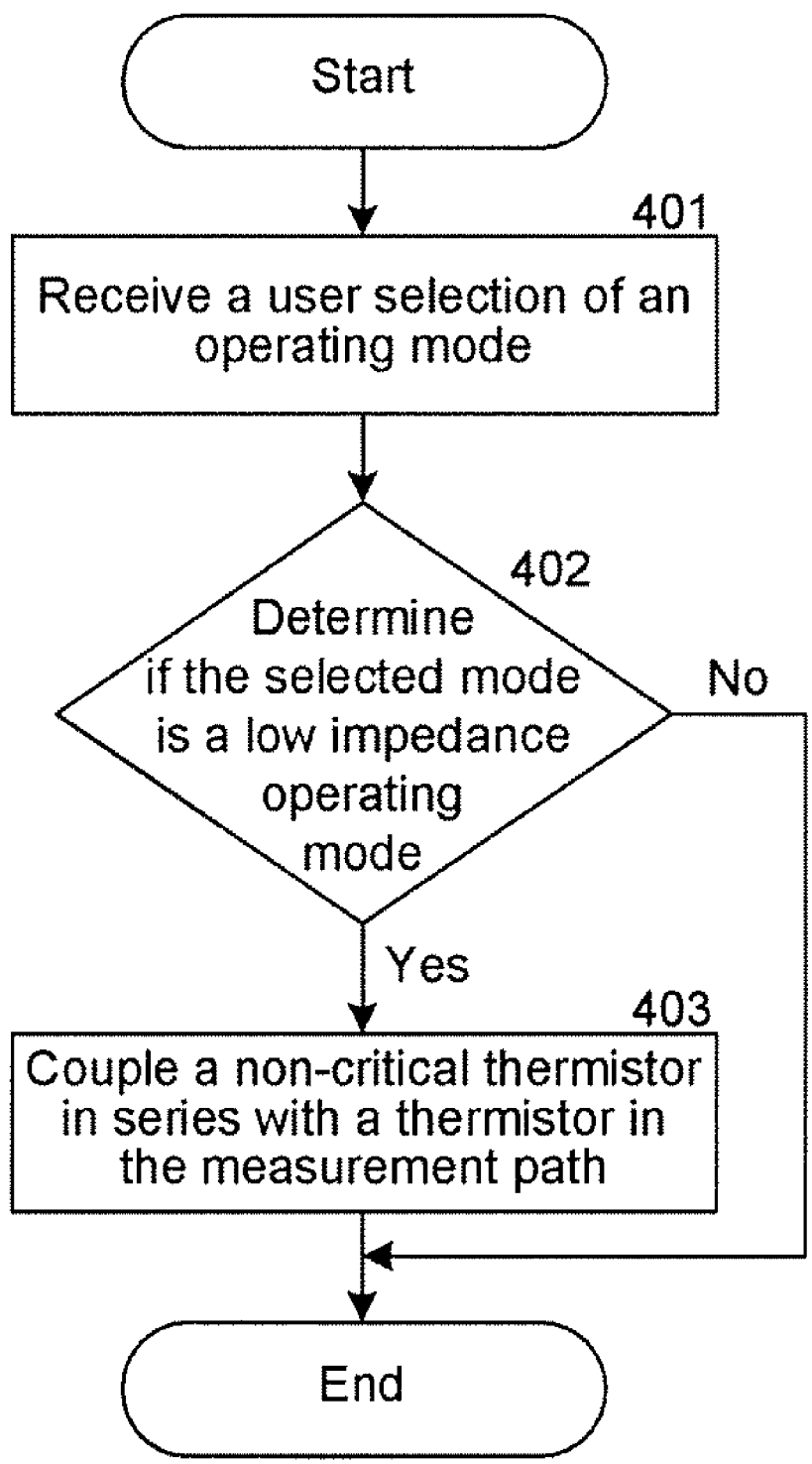
FIG. 4 illustrates a method for operating a digital multimeter in LoZ mode.

Some embodiments can be operated without the use of a rotary switch. In such embodiments, as illustrated in FIG. 4, the multimeter can receive a user selection of an operating mode 401 using one of soft keys 107, determine if the selected mode is a low impedance operating mode 402, and then electromechanically couple a non-critical thermistor in series with a thermistor in the measurement path 403 if the low impedance mode has been selected in step 402.

Increased Size of Lands

In some embodiments, the circuit board on which multimeter components are mounted can include differentially sized lands for mounting components such as thermistors RT1 and RT2. The lands can be areas of copper, or other metal, connected to the through holes for mounting RT1 and/or RT2. By making mounting pads with larger lands, heat dissipation can be increased. That is, a thermistor with smaller lands will heat up first and retain heat longer. The thermistor mounted to the larger lands will dissipate heat at a relatively faster rate. The increased size of the lands increases the rate at which heat can be dissipated from the components on the lands.

Figure 5:
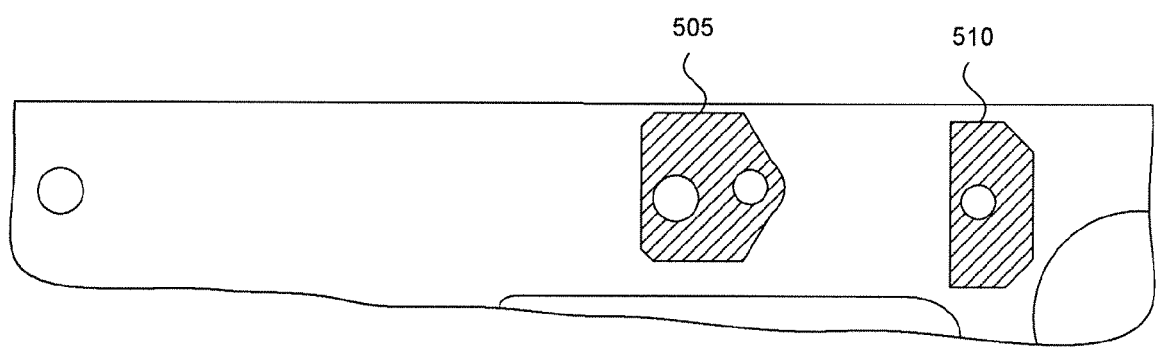
FIG. 5 illustrates a printed circuit board having differential sized lands.

In some embodiments, it is desired to dissipate the heat of the thermistor in the measurement path as quickly as possible. With reference to FIG. 5, the mounting area for RT1 can include relatively larger lands 505 and 510. In some embodiments, RT2 may have lands smaller than those of RT1 or may have no lands.

ADDITIONAL EXAMPLES

Different DMMs used with the disclosed systems and methods can have different degrees of accuracy. Some high accuracy DMMs can be accurate to 0.025% of the measured reading while lower accuracy instruments may be accurate to 0.1% or 0.05% of the measured reading. Thermistor heating of the printed circuit board can create thermal problems which impact the accuracy of the instruments. While higher accuracy DMMs might not return to normal sensitivity for a long time, a user may like to know when normal operating temperatures and accuracy have been reached.

In some embodiments, the DMM can allow use of its measurement functions while some of its components are not at their normal operating temperatures. In some such embodiments, if the DMM is heated to a temperature outside of the normal operating temperatures, the DMM will detect this temperature with a temperature sensor and automatically display measurements at a reduced precision until the temperature falls sufficiently. As a non-limiting example, the DMM that has exceeded its rated temperature may only display voltage at millivolt precision until the temperature returns to normal, at which point the unit will again display voltages at microvolt precision.

In some embodiments, the DMM can include an indicator for displaying when the DMM has returned to normal operations temperatures. In some embodiments, the indicator displays the temperature of one or more portions of the printed circuit board. In other embodiments, the display can indicate a binary condition of "READY," "WAIT," or another condition based on the temperatures of one or more portions of the circuit board.

In some embodiments, the DMM could include a timer. Once the LoZ function is used or a component has otherwise been heated to a temperature outside of its normal operating range, a processor can begin a timer to count down the period of time required for the component to reach the normal operating temperature. The period of time could be based on the voltage applied when the LoZ or other function was used, or the measured temperature of the component or components in question. This time can be indicated on display 105.

In some embodiments, the heat generated by the thermistors can be vented by air passages that vent heat past thermistors RT1 and RT2. In such embodiments, the DMM can be sealed properly to reduce the risk of electric shock.

In some embodiments, a heat sink can be attached directly to one more of thermistors RT1 and RT2. The heat sink can be selected so that the thermistor heats at a rate sufficient to perform a protective function by increasing resistance quickly to decrease current through the DMM yet dissipates heat quickly enough to enable the DMM to return to normal operating conditions more quickly.

CONCLUSION

Many specific details of certain embodiments of the invention are set forth in the description and in FIGS. 1-5 to provide a thorough understanding of these embodiments. A person skilled in the art, however, will understand that the invention may be practiced without several of these details or additional details can be added to the invention. In particular, while the description above is provided with specific reference to thermistors, the systems and methods could also be applied to any other component which can become heated in excess of its normal operating temperatures. Well-known structures and functions have not been shown or described in detail to avoid unnecessarily obscuring the description of the embodiments of the invention. As used herein, one or more components "coupled" to each other can be coupled directly (i.e., no other components are between the coupled components) or indirectly (i.e., one or more other components can be placed between the coupled components).

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined or altered to provide further embodiments.

These and other changes can be made to the invention in light of the above Detailed Description. While the above description describes certain embodiments of the invention, and describes the best mode contemplated, no matter how detailed the above appears in text, the invention can be practiced in many ways. Details of the system may vary considerably in its implementation details, while still being encompassed by the invention disclosed herein.

The terminology used in the Detailed Description is intended to be interpreted in its broadest reasonable manner, even though it is being used in conjunction with a detailed description of certain specific embodiments of the invention. Certain terms may even be emphasized; however, any terminology intended to be interpreted in any restricted manner will be overtly and specifically defined as such in this Detailed Description section. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention under the claims.

I claim:

1. An apparatus for dissipating heat generated during an electrical function, comprising:
    a first thermistor coupled in series with a resistor in a measurement path;
    a second thermistor, the second thermistor is selected to be of a greater resistance than the first thermistor; and
    a switch coupled to the measurement path and the second thermistor for selectively coupling the second thermistor to the measurement path.

2. The apparatus of claim 1, wherein the second thermistor comprises two terminals and is coupled to the measurement path at a first terminal and coupled to a ground at the second terminal.

3. The apparatus of claim 1, further comprising a rotary switch on a multimeter device for operating the switch coupled to the measurement path.

4. The apparatus of claim 1, wherein the first thermistor is mounted on lands for dissipating heat, and wherein the second thermistor is not mounted on lands.

5. The apparatus of claim 1, wherein the first thermistor is mounted on a first set of lands for dissipating heat, and wherein the second thermistor is mounted on a second set of lands for dissipating heat, wherein the first set of lands is larger than the second set of lands.

6. An apparatus for dissipating heat generated during an electrical function, comprising:
    a first thermistor coupled in series with a resistor in a measurement path;
    a second thermistor;
    a switch coupled to the measurement path and the second thermistor for selectively coupling the second thermistor to the measurement path; and
    a temperature sensor configured to detect a temperature of one or more of the first thermistor and second thermistor.

7. The apparatus of claim 6, further comprising a processor configured to:
    determine if the detected temperature is above a predetermined threshold; and
    if the detected temperature is above a predetermined threshold, display a measurement at a reduced level of precision.

8. The apparatus of claim 6, further comprising a processor configured to:
    determine if the detected temperature is above a predetermined threshold;
    if the detected temperature is above a predetermined threshold, displaying an error message on an attached display.

9. The apparatus of claim 6, further comprising a processor configured to:
    determine a period time required for the first thermistor to reach a normal operating temperature; and
    display the determined period time on an attached display.

10. The apparatus of claim 6, wherein the first thermistor, second thermistor, and switch are housed in a digital multimeter.

11. An apparatus for dissipating heat generated during an electrical function, comprising:
- a first thermistor coupled in series with a resistor in a measurement path;
- a second thermistor;
- a switch coupled to the measurement path and the second thermistor for selectively coupling the second thermistor to the measurement path;
- a soft key to selecting a low impedance mode; and
- a processor for receiving a selection from the soft key and operating the switch to couple the second thermistor in the measurement path.

* * * * *